(12) United States Patent
Hatta et al.

(10) Patent No.: US 6,556,597 B2
(45) Date of Patent: Apr. 29, 2003

(54) LASER DIODE MODULE

(75) Inventors: Tatsuo Hatta, Hyogo (JP); Kiyohide Sakai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 4 days.

(21) Appl. No.: 09/796,559

(22) Filed: Mar. 2, 2001

(65) Prior Publication Data

US 2001/0036204 A1 Nov. 1, 2001

(30) Foreign Application Priority Data

Mar. 3, 2000 (JP) ........................................ 2000-058828

(51) Int. Cl.[7] .............................. H01S 3/30; H01S 3/10; H01S 3/08
(52) U.S. Cl. ............................... 372/6; 372/18; 372/21; 372/22; 372/23; 372/102; 372/108
(58) Field of Search ............................... 372/6, 18, 21, 372/22, 23, 102, 108, 96

(56) References Cited

U.S. PATENT DOCUMENTS

| | | | | |
|---|---|---|---|---|
| 4,726,645 A | * | 2/1988 | Yamashita et al. | 350/96.18 |
| 5,315,436 A | * | 5/1994 | Lowenhar et al. | 359/569 |
| 5,724,377 A | | 3/1998 | Huang | |
| 6,167,075 A | * | 12/2000 | Craig et al. | 372/75 |
| 6,275,511 B1 | * | 8/2001 | Pan et al. | 372/6 |

FOREIGN PATENT DOCUMENTS

JP          11-214794         8/1999

* cited by examiner

*Primary Examiner*—Eddie Lee
*Assistant Examiner*—Joseph Nguyen
(74) *Attorney, Agent, or Firm*—Burns, Doane, Swecker & Mathis, LLP

(57) ABSTRACT

A laser diode module includes a laser diode, a lens located on an optical path of light emitted from the laser diode, and an optical fiber located to receive the emitted light concentrated by the lens. The optical fiber includes a fiber grating having a reflection center wavelength greater than the cutoff wavelength of the laser diode and having a half-width of reflection spectrum ranging from twice the spacing of longitudinal modes of the laser diode to 10 nm.

8 Claims, 6 Drawing Sheets

LASER DIODE MODULE

BACKGROUND OF THE INVENTION

1. Field of the Invention

The present invention relates to a laser diode module used as a light source for exciting an optical fiber amplifier.

2. Description of the Background Art

FIG. 13 schematically shows a structure of a conventional laser diode module disclosed in U.S. Pat. No. 5,724,377. The laser diode module includes a laser diode 1 and an optical fiber 12 located on an optical path of light emitted from laser diode 1. Laser diode 1 emits light with a wavelength of 982 nm when there is no optical feedback. Optical fiber 12 has a microlens part 13 at its tip where light is incident as well as a part where a fiber grating 4 is formed that reflects light with a center wavelength of 980 nm. In general, the fiber grating is formed to cause refractive index to periodically change in the optical fiber. Because of the periodic change of the refractive index, the fiber grating has characteristics that it only reflects a constant amount of light having a specific wavelength according to the rate of change in refractive index. The fiber grating can be manufactured by exposing an optical fiber to ultraviolet radiation.

A laser beam emitted from laser diode 1 enters microlens part 13 to be converted from diffused light into parallel light and propagates as the parallel light through the inside of optical fiber 12. The laser beam passing through optical fiber 12 to reach fiber grating 4 is reflected from fiber grating 4 to be returned to laser diode 1. In a composite resonator thus structured, the wavelength of laser diode 1 is not 982 nm as indicated above but 980 nm which is the center wavelength of fiber grating 4, and the wavelength of laser diode 1 is locked or fixed on this wavelength. In other words, regardless of forward current applied to laser diode 1 and ambient temperature of the laser diode, a stable optical output with a wavelength of 980 nm can be achieved.

FIG. 14 shows a relation between optical output Pf from an end of the fiber and forward current If of the laser diode to compare the laser diode module having fiber grating 4 within optical fiber 12 thereby returning the laser beam to laser diode 1 as described above with a laser diode module with no fiber grating. The laser diode module without fiber grating has characteristics indicated by the dotted line while the laser diode having fiber grating 4 has characteristics indicated by the solid line. It is apparent from FIG. 14 that, regarding the laser diode module having fiber grating 4, the maximum optical output which is possible without occurrence of kink (hereinafter referred to "maximum kink-free optical output power") remarkably decreases. A resultant problem is that the available optical output of the laser diode module having the fiber grating is nearly a half of the optical output which is possible by the laser diode module with no fiber grating. "Kink" refers to a phenomenon that occurrence of beam steering eliminates linearity between optical output within the optical fiber and forward current applied to the laser diode, which is detailed later.

SUMMARY OF THE INVENTION

One object of the present invention is to solve the problem above by providing a laser diode module enabling a sufficiently great maximum kink-free optical output power even when a wavelength to be used is locked on a desired value by means of a fiber grating.

According to one aspect of the invention, for the purpose of achieving the object above, a laser diode module of the present invention includes a laser diode, a lens located on an optical path of light emitted from the laser diode, and an optical fiber located to receive the emitted light concentrated by the lens. The optical fiber includes a fiber grating having a reflection center wavelength greater than cutoff wavelength of the laser diode and having a half-width of reflection spectrum ranging from twice the spacing between longitudinal modes of the laser diode to 10 nm.

When this structure is employed, the reflection center wavelength of the fiber grating is greater than the cutoff wavelength. Accordingly, fundamental transverse mode dominates high-order transverse mode thereby suppresses high-order transverse mode oscillation. Further, the fiber grating has its half-width of reflection spectrum that is at least twice the spacing of longitudinal modes and thus the fiber grating has a reflection band containing a plurality of longitudinal modes of the laser diode. Oscillation of a plurality of longitudinal modes stabilizes optical output. In addition, the fiber grating has a half-width of reflection spectrum that is 10 nm or less, the wavelength can be controlled to a precision of 10 nm or less.

According to another aspect of the invention, a laser diode module includes a laser diode, a lens located on an optical path of light emitted from the laser diode, and an optical fiber located to receive the emitted light concentrated by the lens. The optical fiber includes a fiber grating having a reflection center wavelength greater by at least 2 nm than gain peak wavelength of the laser diode and having a half-width of reflection spectrum ranging from twice the spacing between longitudinal modes of the laser diode to 10 nm.

By employing this structure, the maximum kink-free optical output power can efficiently be increased since the maximum kink-free optical output power sharply increases as seen from the experimental result shown in FIG. 5 when the difference between the reflection center wavelength and the gain peak wavelength (oscillation center wavelength of the laser diode itself) exceeds 2 nm.

Preferably, when a fundamental transverse mode parallel to a crystal growth layer of the laser diode matches a fundamental transverse mode of the optical fiber at a magnification called fundamental transverse mode matching magnification, coupling magnification of the laser diode and the optical fiber has a value between the fundamental transverse mode matching magnification and a magnification producing a maximum coupling efficiency. As seen from the experimental result shown in FIG. 11, the maximum kink-free optical output power can be increased to a greatest value by employment of this structure.

Preferably, the laser diode is of ridge waveguide type and produces oscillation at 980 nm. This structure can be used to apply the laser diode to use as an optical source for excitation of an optical fiber amplifier.

Preferably, the lens is a cylindrical lens provided on a light-incident end of the optical fiber. When this structure is employed, the magnification is 1 with respect to the direction perpendicular to the direction where lens effects are exhibited. High-order mode oscillation can accordingly be suppressed and thus the maximum kink-free optical output power increases.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Structure

Figure 1:
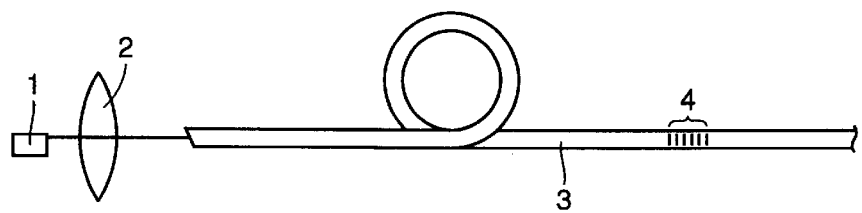
FIG. 1 schematically shows a structure of a laser diode module according to a first embodiment of the present invention.

FIG. 1 shows a laser diode module according to this embodiment. The laser diode module includes a laser diode 1, a convex lens 2 located on an optical path of light emitted from laser diode 1, and a polarization maintaining optical fiber 3 located to receive a light beam concentrated by convex lens 2. Polarization maintaining optical fiber 3 has its part formed into a fiber grating 4 of a short period that is produced by ultraviolet radiation. Fiber grating 4 reflects light with a center wavelength of 982 nm, and peak reflectance is 5% and half-width of reflection spectrum is 0.6 nm. The distance between laser diode 1 and fiber grating 4 is approximately 1 m.

Figure 2:
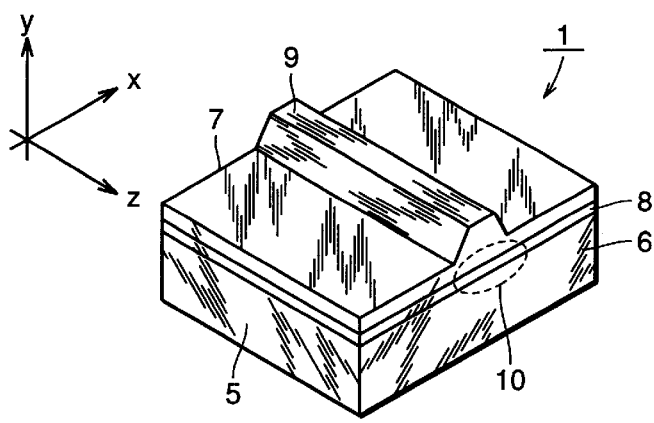
FIG. 2 is a perspective view of a laser diode according to the first embodiment.

Referring to FIG. 2, a structure of laser diode 1 itself is described. Laser diode 1 has a AlGaAs semiconductor chip 5 as a substrate, and includes, on the side from which light is emitted, a front reflection mirror 6 having a reflectance of 1% that is formed through vapor deposition of multiple dielectric films, and includes, on the opposite side of the light-emitting side, a rear reflection mirror 7 of reflectance 90% that is also formed by vapor deposition of multiple dielectric films. On the top of AlGaAs semiconductor chip 5, there is provided an optical waveguide layer 8 formed through crystal growth and a ridge 9 is further provided thereon that is formed through etching. Laser beam oscillation by laser diode 1 is ejected from a laser-emitting part 10. For convenience of description herein, the direction parallel to ridge 9 in FIG. 2 is called z-axis, the direction parallel to optical waveguide layer 8 and orthogonal to z-axis is called x-axis, and the direction orthogonal to z-axis and x-axis is called y-axis.

A longitudinal mode produced by oscillation of laser diode 1 has its wavelength varied depending on temperature and forward current of laser diode 1. Therefore, the relation between the reflection center wavelength of fiber grating 4 and the wavelength of the longitudinal mode is not constant. In order to stabilize output of all light rays, it is necessary to design fiber grating 4 that has its reflection band containing a plurality of longitudinal modes of the laser diode thereby causing emission of multiple longitudinal modes all the time. In consideration of this, 0.6 nm is selected as the half-width of reflection spectrum of fiber grating 4, that is greater than twice the longitudinal-mode spacing of 0.14 nm of laser diode 1. Further, it is required for the laser diode module to control the wavelength to a precision of 10 nm or less. In view of this, the upper limit of the half-width is restricted to approximately 10 nm. Accordingly, a light source for excitation that employs a fiber grating for stabilizing wavelength is required to have the fiber grating with the half-width of reflection spectrum in a range from twice the longitudinal-mode spacing of the laser diode to 10 nm.

General Operation

A laser beam emitted from laser diode 1 is concentrated by convex lens 2 and propagated as parallel light through the inside of polarization maintaining optical fiber 3. The laser beam propagated through within polarization maintaining optical fiber 3 to fiber grating 4 is reflected by fiber grating 4 to be returned to laser diode 1. The laser oscillation wavelength of laser diode 1 is locked nearly on 982 nm by the laser beam returned from fiber grating 4 (hereinafter called "reflection return light"), and the laser oscillation is stabilized near 982 nm regardless of forward current through laser diode 1 and temperature thereof.

The distance of about 1 m between laser diode 1 and fiber grating 4 causes disorder of the phase of reflection return light from fiber grating 4. Consequently, the laser beam output from the laser diode module has a coherence collapse. The coherence collapse is not preferred in application to a light source used for communication because it could become a factor in noise increase. However, such noise causes no problem in application to an optical source for excitation of an optical fiber amplifier. On the contrary, it may be an advantage in terms of output and wavelength since a moderately stable state is accomplished with respect to disturbance.

Oscillation Mechanism

AlGaAs semiconductor chip 5 supplies forward current and is a gain medium having its gain of nearly 975 nm. The gain medium is provided between front reflection mirror 6 and rear reflection mirror 7 to form a resonator, and laser diode 1 itself oscillates at approximately 975 nm. A laser beam is confined in x-direction within a width of about 3.7 μm because of effective refractive index difference generated by ridge 9, and further confined in y-direction within a width of about 1.6 μm by optical waveguide layer 8. The laser beam produced by laser diode 1 oscillates in a plurality of longitudinal modes with spacing $\Delta\lambda$ represented by formula (1) with resonator length L, wavelength $\lambda$ and effective refractive index $n_{eff}$, namely in z-direction.

$$\Delta\lambda = \frac{\lambda^2}{2 \cdot n_{eff} \cdot L} \qquad (1)$$

For example, when L=1 mm, $n_{eff}$=3.6 and $\lambda$=980 nm are assigned to formula (1), the calculated longitudinal spacing $\Delta\lambda$ is about 0.14 nm. In general, when such a laser beam is operated with an output of at least 100 mW, an optical spectrum extends over approximately 10 nm, and dozens of longitudinal modes are emitted.

On the other hand, x-direction and y-direction are called transverse mode. In order to enhance the quality (Q-value) of the laser resonator and increase optical coupling efficiency with respect to polarization maintaining optical fiber 3, oscillation in the lowest-order, unimodal, and single mode only is essential. Taking this into consideration, the shapes of ridge 9 and optical waveguide layer 8 are designed not to propagate high-order transverse modes.

It is known, however, such a single transverse mode is achieved only when forward current applied to laser diode 1 is in a low-current range of 380 mA or less. Optical waveguide layer 8 is produced by crystal growth and maintains a single transverse mode even with a high current, therefore, a stable single transverse mode is possible in y-direction. On the other hand, confinement in x-direction is relatively weak so that application of a high-current could cause oscillation in a high-order mode. As a result, "beam steering" occurs that is a phenomenon of distortion in the shape and direction of a laser beam. When the laser beam is coupled with the optical fiber, occurrence of such beam steering causes lost of linearity between optical output in the optical fiber and forward current flowing through the laser diode. Then, an available optical output has a restricted upper limit. The phenomenon that the linearity is lost between the optical output in the optical fiber and the forward current applied to the laser diode is called "kink."

Study by Inventors

Inventors have revealed through experiments that occurrence of kink in a laser diode module having the structure as shown in FIG. 1 is strongly related with reflection center wave $\lambda_{fg}$ of fiber grating 4.

Figure 3:
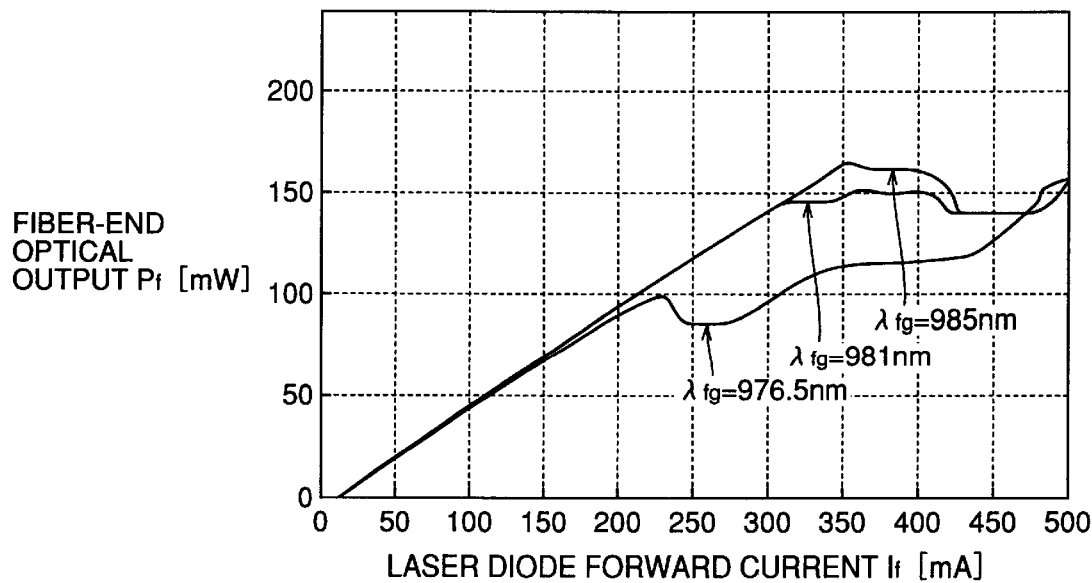
FIG. 3 is a graph showing a relation between fiber-end optical output and forward current applied to the laser diode of the laser diode module according to the first embodiment.

FIG. 3 shows a relation between fiber-end optical output $P_f$ and forward current $I_f$ applied to the laser diode. The three lines shown in FIG. 3 represent $P_f$-$I_f$ characteristics for $\lambda_{fg}$ of 976.5 nm, 981 nm and 985 nm respectively. It is seen from FIG. 3 that the maximum kink-free optical output power increases with increase of $\lambda_{fg}$. This laser diode device has characteristics that it exhibits kink with $I_f$=380 nm even when no fiber grating is provided, due to beam steering of the device itself. From FIG. 3, it is understood that the maximum kink-free optical output power when the 985 nm fiber grating is provided is almost equal to that of the laser diode device without fiber grating. The reason for this relation between reflection center wave $\lambda_{fg}$ and maximum kink-free optical output power is that a high-order mode of the laser diode is likely to be generated when there is reflection return light by the fiber grating.

Figure 4:
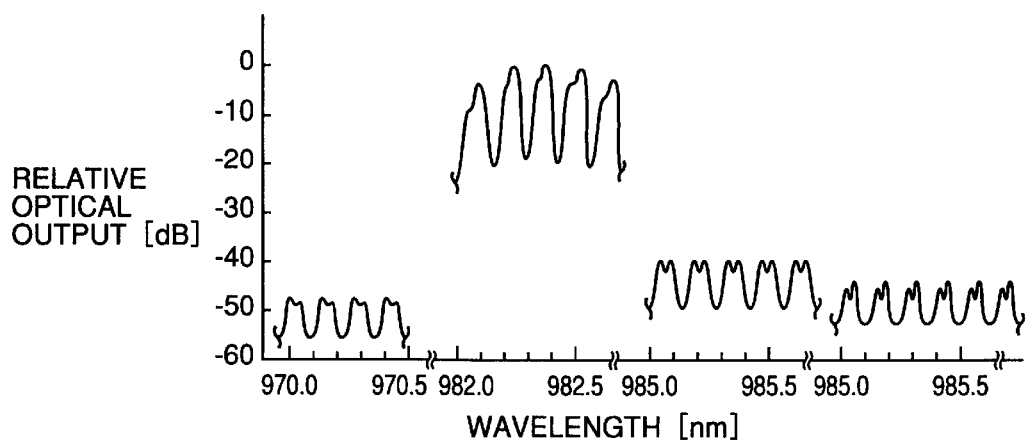
FIG. 4 is a graph showing optical spectrum in the presence of reflection return light by a fiber grating of the laser diode module according to the first embodiment.

FIG. 4 shows optical spectrum when there is reflection return light by the fiber grating. It is seen from FIG. 4 that each longitudinal mode has a dual-modal at intervals of 30 pm, which corroborates generation of a high-order transverse mode in x-direction. One of the peaks of the dual-modal that is on the long-wavelength side is fundamental transverse mode and the other on the short-wavelength side is high-order transverse mode. With 985 urn as a border, longitudinal modes at longer wavelengths exhibit the fundamental transverse mode stronger than the high-order transverse mode and longitudinal modes at shorter wavelengths exhibit the high-order transverse mode stronger than the fundamental transverse mode.

A wavelength where the fundamental and high-order transverse modes have the same gain is herein called "cutoff wavelength". The result of FIG. 4 shows that, in the region where the wavelength is longer than the cutoff wavelength, the fundamental transverse mode is stronger than the high-order transverse mode thereby suppresses the high-order transverse mode. The result of FIG. 4 accordingly indicates that generation of the high-order transverse mode can be suppressed by using a fiber grating having a reflection center wavelength greater than the cutoff wavelength to lock the oscillation wavelength and thus the kink-free optical output can be increased.

Figure 5:
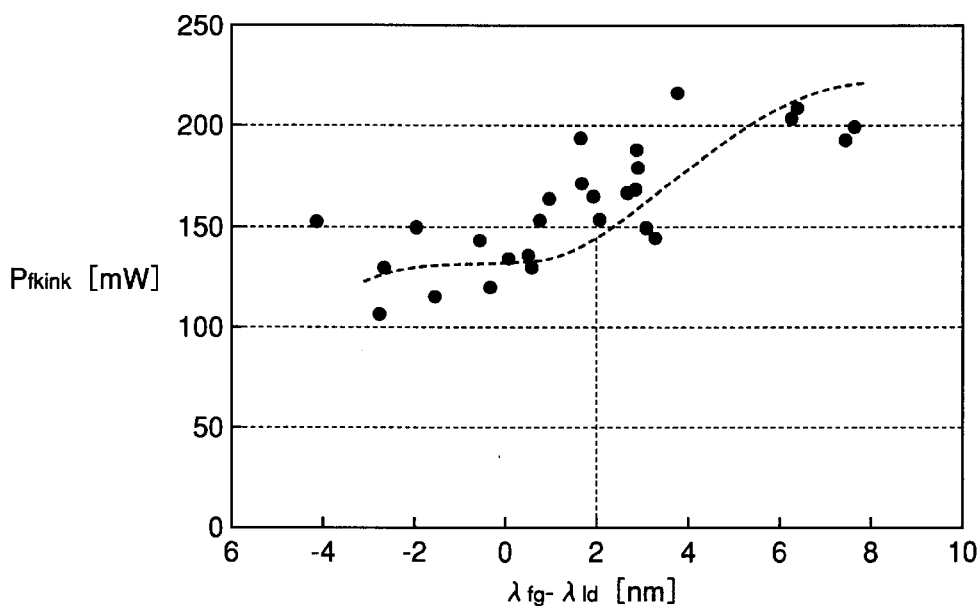
FIG. 5 is a graph showing a relation between difference between reflection center wavelength of the fiber grating and oscillation center wavelength of the laser diode itself and maximum kink-free optical output power of the laser diode module according to the first embodiment.

FIG. 5 shows a relation between oscillation center wavelength (also called "gain peak wavelength") $\lambda_{ld}$ without reflection from a fiber grating, i.e. gain peak wavelength of a laser diode itself, reflection center wavelength $\lambda_{fg}$ of a fiber grating, and maximum kink-free optical output power $P_{fkink}$ that is obtained by measurement for some combinations of different devices and fiber gratings. The lateral axis indicates difference $\lambda_{fg}-\lambda_{ld}$ between the reflection center wavelength and oscillation center wavelength. From FIG. 5, it is also seen that $\lambda_{fg}-\lambda_{ld}$ and maximum kink-free optical output power $P_{fkink}$ has a correlation in the region less than the cutoff wavelength. In particular, in the region of $\lambda_{fg}-\lambda_{ld}>2$ nm, $P_{fkink}$ sharply increases as $\lambda_{fg}$ increases.

Therefore, even if restrictions such as absorption characteristics of an optical fiber amplifier inhibit reflection center wavelength $\lambda_{fg}$ of the fiber grating from being set to a wavelength longer than the cutoff wavelength, the maximum kink-free optical output power can be increased by maintaining the relation $\lambda_{fg}-\lambda_{ld}>2$ nm.

In order to make this relation stable, a laser diode may be fabricated by intentionally shifting oscillation center wavelength $\lambda_{ld}$ by a desired wavelength to the side shorter than wavelength $\lambda_{fg}$ where the frequency should be locked. Generally, when the laser is used as an optical source for excitation of an optical fiber amplifier, $\lambda_{fg}$ is set to 980 nm. Therefore, if $\lambda_{ld}$ is shifted to the shorter-wavelength side close to 970 nm, the maximum kink-free optical output power can sufficiently be increased regardless of change in temperature and humidity.

Optical Coupling State

Figure 6:
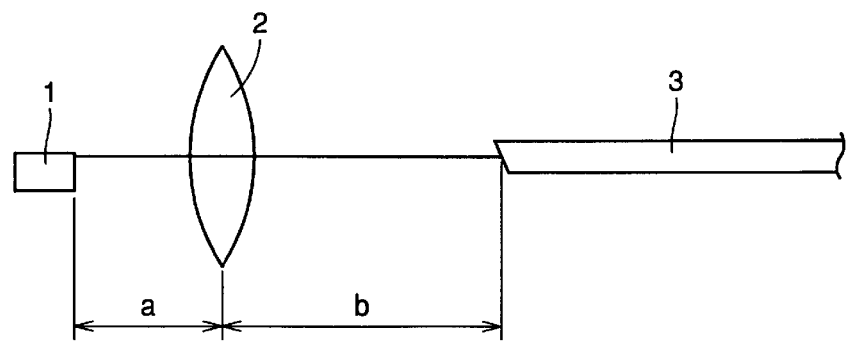
FIG. 6 illustrates an optical coupling state between the laser diode and a polarization maintaining optical fiber of the laser diode module according to the fist embodiment.
Figure 7:
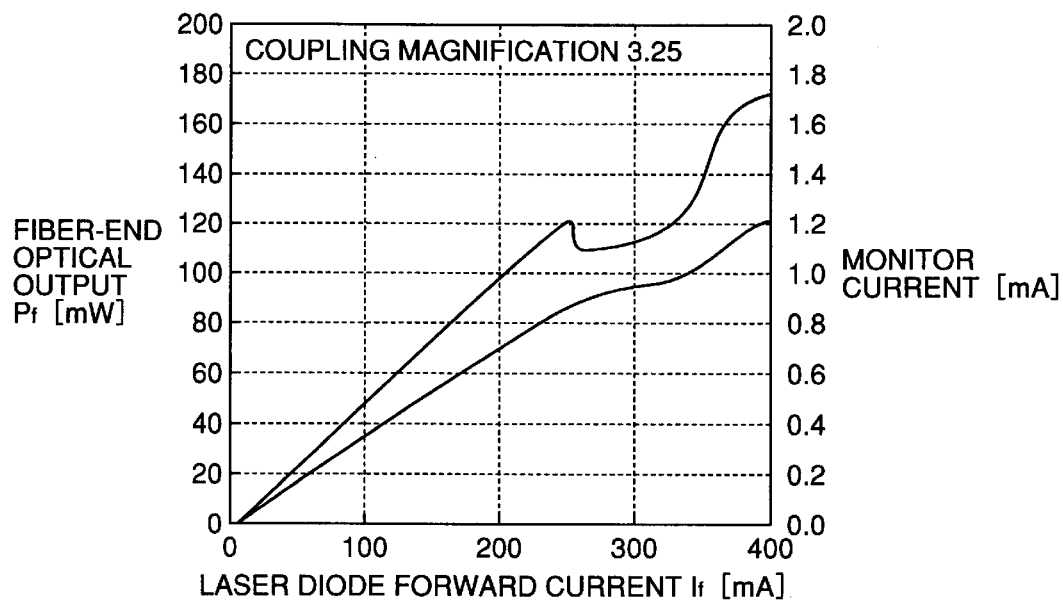
FIGS. 7–10 are graphs showing results of measurement with respect to Pf-If characteristics when coupling magnification is 3.25, 2.67, 2.01 and 1.67 respectively for the laser diode module according to the first embodiment.
Figure 8:
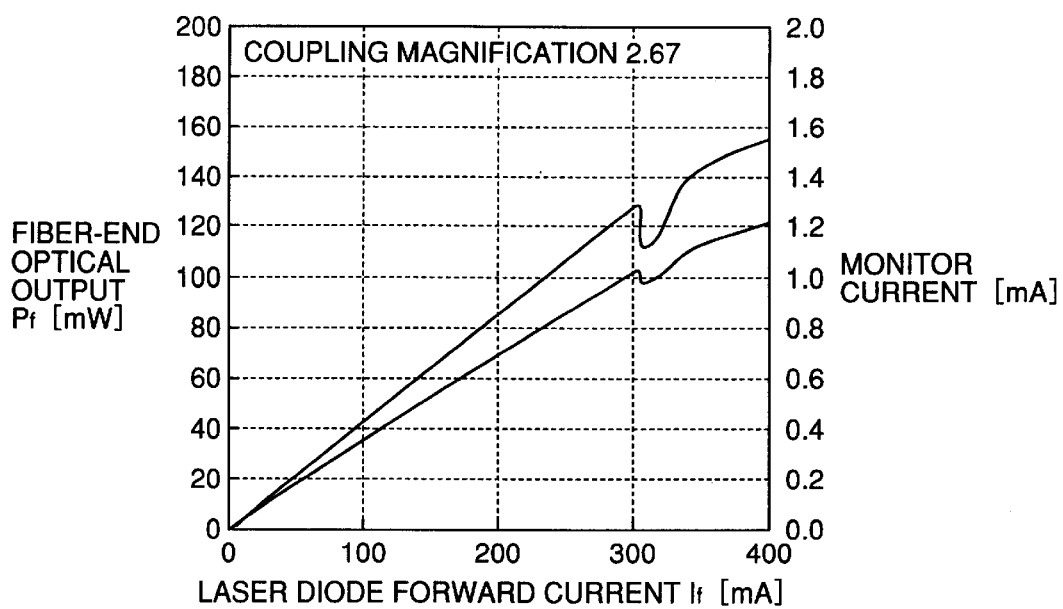

Occurrence of kink is due to generation of high-order transverse modes in x-direction. Therefore, optical coupling state with respect to convex lens 2 also affects kink. Referring to FIG. 6, an optical coupling state between laser diode 1 and polarization maintaining optical fiber 3 is described. The laser diode module shown in FIG. 6 includes laser diode 1, convex lens 2 and polarization maintaining optical fiber 3. When the distances a and b are defined as shown in FIG. 6 and the focal length of convex lens 2 is f, these parameters have the relation presented by formula (2).

$$\frac{1}{f} = \frac{1}{a} + \frac{1}{b} \qquad (2)$$

At this time, formula (3) with a and b provides a magnification (hereinafter called "coupling magnification") m that is an important parameter in determination of optical coupling efficiency between single transverse modes.

$$m = \frac{b}{a} \qquad (3)$$

Figure 9:
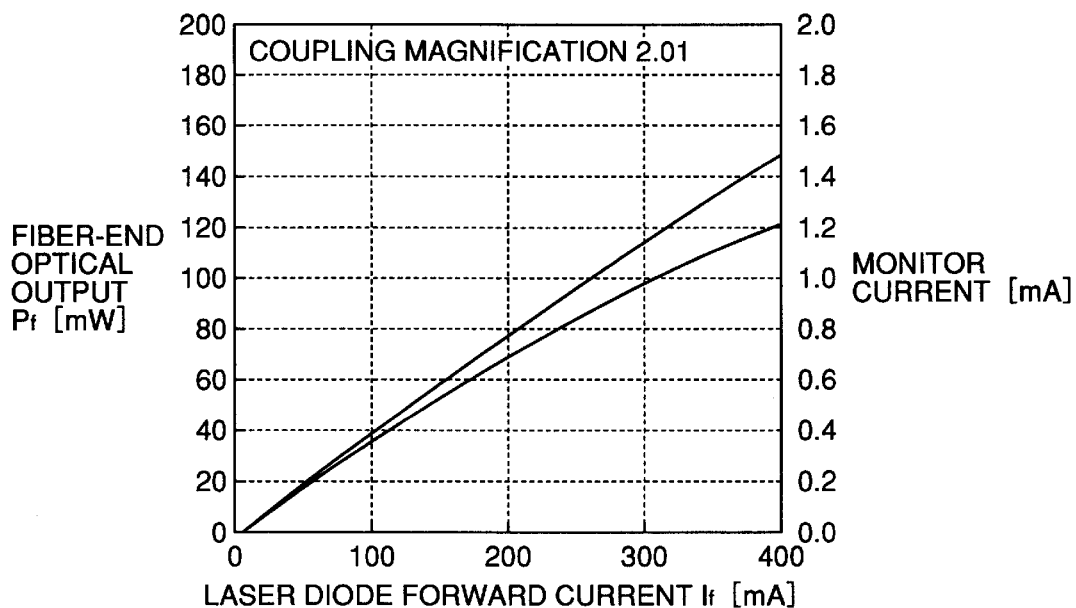
Figure 10:
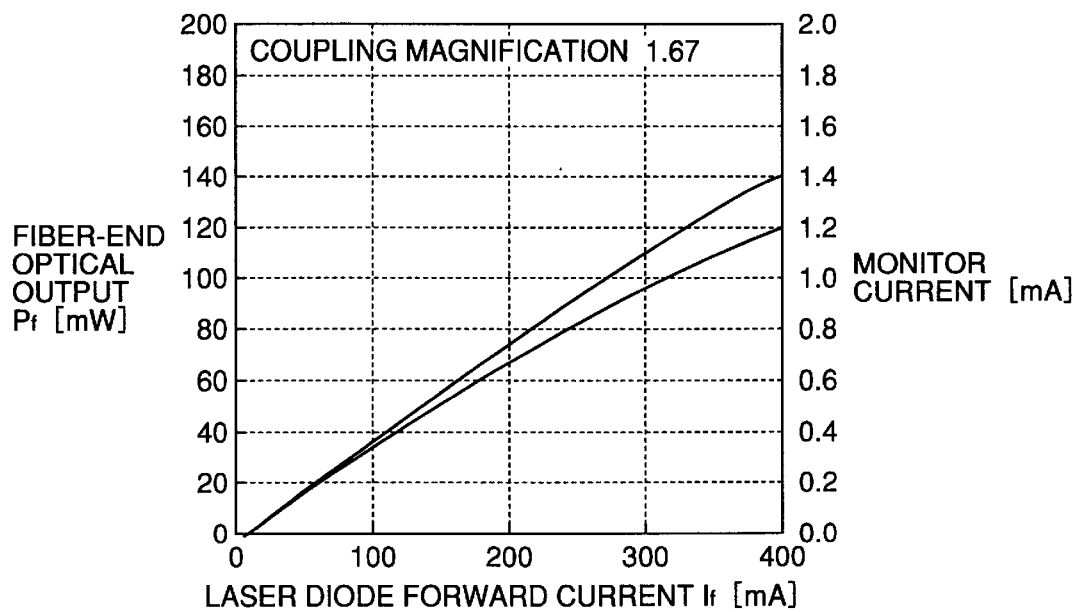

Laser-emitting part 10 of laser diode 1 is elliptical in shape having dimensions of 3.7 $\mu$m in x-direction and 1.6 $\mu$m in y-direction. Then, an average beam diameter of the laser is equal to geometric mean $\sqrt{(3.7 \times 1.6)}=2.43$ $\mu$m. Polarization maintaining optical fiber 3 has a beam diameter of 6 μm in both of x- and y- directions. It is thus preferable to have m=6/2.43 =2.5 for the purpose of alleviating transverse-mode mismatch with respect to both of x- and y-directions. However, according to this embodiment, coupling magnification m is set to approximately 2 to attach a higher priority to transverse mode matching in x-direction than to the loss due to transverse mode mismatch in y-direction. FIGS. 7–10 show results of measurements conducted for obtaining Pf-If characteristics regarding four coupling magnifications respectively. As shown in FIG. 9, a kink-free operation is accomplished when forward current If is equal to or less than 400 mA for coupling magnification of 2.01. As the coupling magnification increases, the beam diameter of reflection return light from the fiber grating decreases and the degree of expansion increases on the end surface of the laser diode on which the beam is incident. Accordingly, with increase of coupling magnification, there is a higher possibility that a high-order transverse mode in x-direction occurs.

Figure 11:
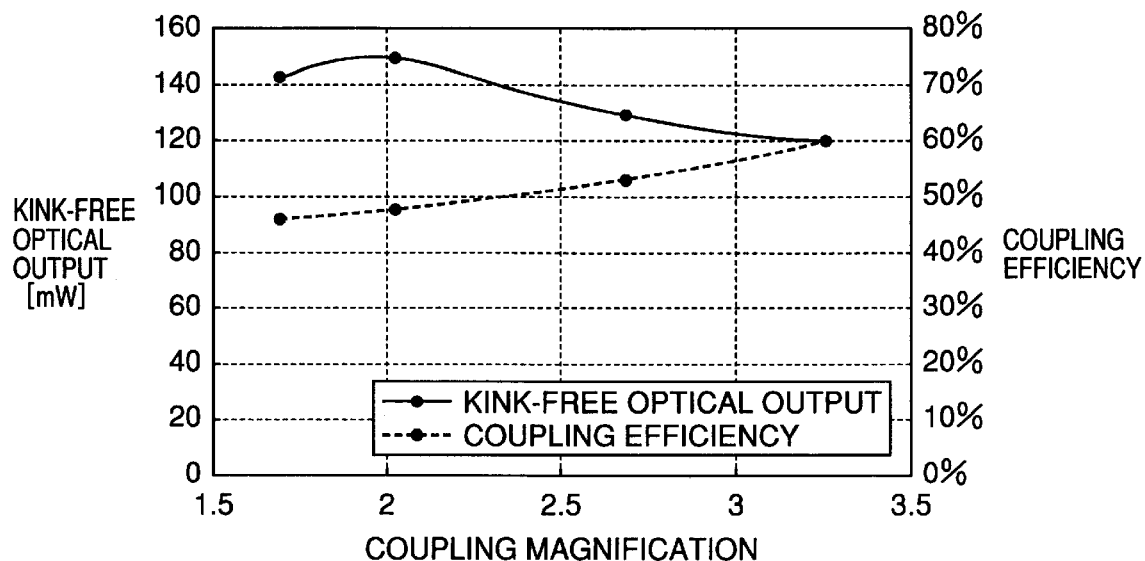
FIG. 11 is a graph showing an experimental result regarding a relation between coupling magnification, coupling efficiency and maximum kink-free optical output power for the laser diode module according to the first embodiment.

FIG. 11 shows an experimentally obtained result regarding a relation between coupling magnification, coupling efficiency and maximum kink-free optical output power. When the convex lens is arranged to accomplish a coupling magnification smaller than 2.5 which theoretically provides the highest coupling efficiency and greater than 6/3.7=1.6 which provides transverse mode matching in x-direction, the greatest maximum kink-free optical output power can be achieved. In other words, this result corroborates that the maximum kink-free optical output power can be increased to the greatest value with magnification coupling 2.01 among those shown in FIGS. 7–10.

It is noted that regardless of the fact that the coupling magnification of 2.5 theoretically provides a highest coupling efficiency, the coupling efficiency is enhanced in FIG. 11 even with the magnification greater than 2.5. This is because the convex lens used here has the minimum aberration with the coupling magnification of 4.5 and thus the aberration is greater with 2.5.

Second Embodiment

Figure 12:
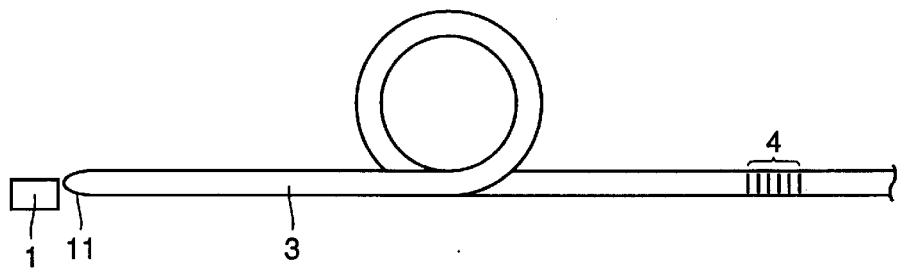
FIG. 12 schematically shows a structure of a laser diode module according to a second embodiment of the invention.
Figure 13:
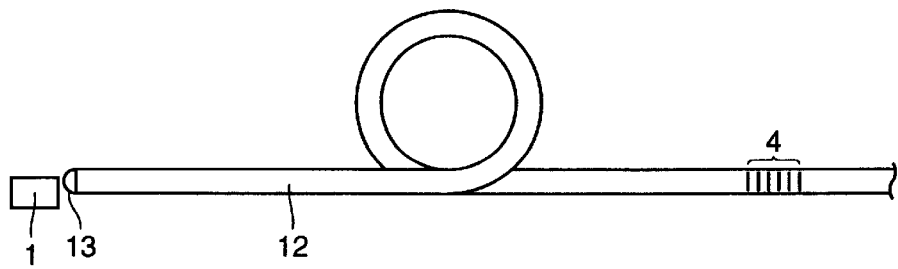
FIG. 13 schematically shows a structure of a conventional laser diode module.
Figure 14:
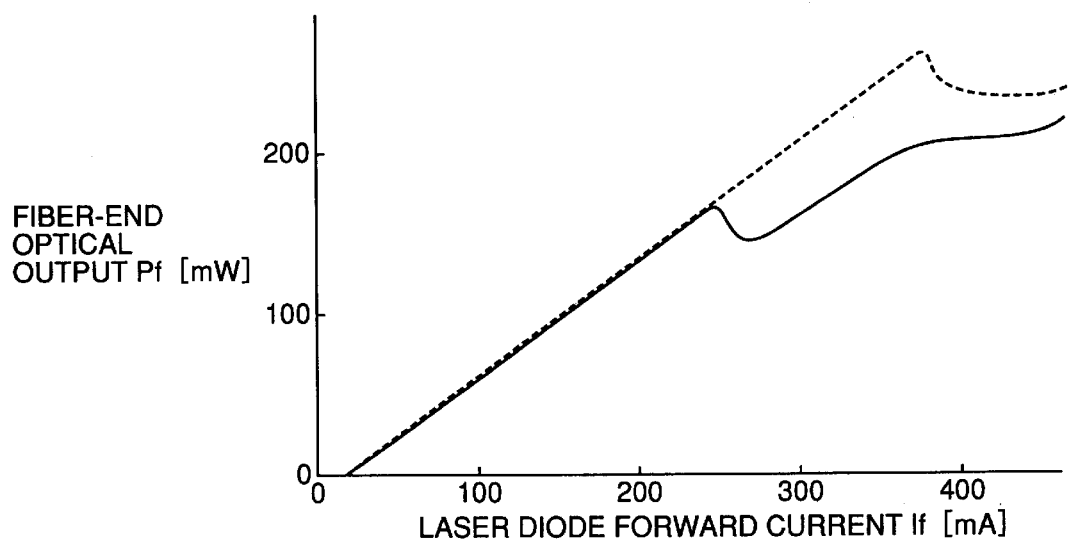
FIG. 14 is a graph showing a relation between fiber-end optical output and laser diode forward current If.

For implementing the coupling magnification of 2.01, the first embodiment uses the convex lens having coupling magnification 2.01 with respect to both of x- and y-directions. Different magnifications may alternatively be set for x- and y-directions. FIG. 12 shows a laser diode module according to a second embodiment. The laser diode module includes, instead of convex lens 2 (see FIG. 1), a cylindrical lens part 11 forming a light-incident end surface of a polarization maintaining optical fiber 3. Regarding other structural components, this laser diode is identical to that of the first embodiment.

According to the example shown in FIG. 12, cylindrical lens part 11 exhibits lens effects only in y-direction. Therefore, magnification in x-direction is 1 which can suppress high-order mode oscillation. The maximum kink-free optical output power thus increases.

Effect of the Invention

The reflection center wavelength of the fiber grating is greater than the cutoff wavelength of the laser diode discussed above. Accordingly, fundamental transverse mode dominates high-order transverse mode thereby suppresses high-order transverse mode oscillation. Further, the fiber grating has its half-width of reflection spectrum that is at least twice the spacing of longitudinal modes and thus the fiber grating has a reflection band containing a plurality of longitudinal modes of the laser diode. Oscillation of a plurality of longitudinal modes stabilizes optical output. In addition, the fiber grating has a half-width of reflection spectrum that is 10 nm or less, the wavelength can be controlled to a precision of 10 nm or less. It is thus possible to achieve the laser diode module producing a sufficiently high kink-free optical maximum output value even when the wavelength to be used is locked on a desired value by the fiber grating.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A laser diode module comprising:

a laser diode;

a lens located on an optical path of light emitted from said laser diode; and an optical fiber located to receive said emitted light concentrated by said lens, said optical fiber including a fiber grating, said fiber grating having a reflection center wavelength greater than cutoff wavelength of said laser diode, and said fiber grating having a half-width of reflection spectrum in a range between twice longitudinal-mode spacing of said laser diode and 10 nm.

2. The laser diode module according to claim 1, wherein said lens is a cylindrical lens provided on a light-incident end of said optical fiber.

3. The laser diode module according to claim 1, wherein when fundamental transverse mode parallel to a crystal growth layer of said laser diode matches fundamental transverse mode of said optical fiber at a magnification called fundamental transverse mode matching magnification, coupling magnification of said laser diode and said optical fiber has a value between said fundamental transverse mode matching magnification and a magnification producing a maximum coupling efficiency.

4. The laser diode module according to claim 3, wherein said laser diode is of ridge waveguide type and produces oscillation at 980 nm.

5. A laser diode module comprising:

a laser diode;

a lens located on an optical path of light emitted from said laser diode; and an optical fiber located to receive said emitted light concentrated by said lens, said optical fiber including a fiber grating, said fiber grating having a reflection center wavelength greater by at least 2 nm than gain peak wavelength of said laser diode, and said fiber grating having a half-width of reflection spectrum in a range between twice longitudinal-mode spacing of said laser diode and 10 nm.

6. The laser diode module according to claim 5, wherein said lens is a cylindrical lens provided on a light-incident end of said optical fiber.

7. The laser diode module according to claim 5, wherein when fundamental transverse mode parallel to a crystal growth layer of said laser diode matches fundamental transverse mode of said optical fiber at a magnification called fundamental transverse mode matching magnification, coupling magnification of said laser diode and said optical fiber has a value between said fundamental transverse mode matching magnification and a magnification producing a maximum coupling efficiency.

8. The laser diode module according to claim 7, wherein said laser diode is of ridge waveguide type and produces oscillation at 980 nm.

* * * * *